(12) United States Patent
Tanaka

(10) Patent No.: US 9,042,737 B2
(45) Date of Patent: May 26, 2015

(54) CLOCK AND DATA RECOVERY UNIT AND POWER CONTROL METHOD THEREFOR AND PON SYSTEM

(75) Inventor: Naruto Tanaka, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 109 days.

(21) Appl. No.: 13/985,128

(22) PCT Filed: Feb. 21, 2012

(86) PCT No.: PCT/JP2012/054094
§ 371 (c)(1),
(2), (4) Date: Aug. 13, 2013

(87) PCT Pub. No.: WO2012/117890
PCT Pub. Date: Sep. 7, 2012

(65) Prior Publication Data
US 2013/0322880 A1    Dec. 5, 2013

(30) Foreign Application Priority Data
Feb. 28, 2011    (JP) .................................. 2011-041254

(51) Int. Cl.
*H04B 10/00*    (2013.01)
*H04L 7/00*    (2006.01)
(Continued)

(52) U.S. Cl.
CPC ............ *H03L 7/0802* (2013.01); *H04L 7/0079* (2013.01); *H04B 10/272* (2013.01); *H04J 3/0655* (2013.01); *H04L 7/033* (2013.01); *H04W 52/0287* (2013.01); *Y02B 60/50* (2013.01); *H04J 14/0247* (2013.01); *H04J 14/0252* (2013.01);
(Continued)

(58) Field of Classification Search
CPC ........................... H04B 10/272; H04L 7/0079
USPC ........... 398/25, 38, 58–66, 98–102, 154–155, 398/202–204, 208
See application file for complete search history.

(56) References Cited

U.S. PATENT DOCUMENTS

| | | | |
|---|---|---|---|
| 2002/0037065 A1* | 3/2002 | Nakamura | .................... 375/375 |
| 2004/0257055 A1* | 12/2004 | Aioanei | ........................ 323/282 |
| 2010/0119024 A1* | 5/2010 | Shumarayev et al. | ........ 375/371 |
| 2012/0008954 A1* | 1/2012 | Tanaka | ............................ 398/67 |

FOREIGN PATENT DOCUMENTS

JP    H11317729 A    11/1999
JP    2001-358582 A    12/2001
(Continued)

*Primary Examiner* — Li Liu
(74) *Attorney, Agent, or Firm* — Drinker Biddle & Reath LLP

(57) ABSTRACT

In the present invention, wasted power consumption caused when a clock and data recovery unit in an optical network unit in a PON system is activated from a power-saving state is reduced and rapid, secure communication is performed. A clock and data recovery unit includes a phase-locked loop that can be set to normal mode or power-saving mode and that includes a voltage-controlled oscillator and recovers a clock signal and a data signal from input signals. The clock and data recovery unit includes a reference clock multiplier circuit that multiplies a reference clock signal and outputs the multiplied reference clock signal; and a frequency training loop that includes the same voltage-controlled oscillator and performs synchronous oscillation training by the voltage-controlled oscillator using the reference clock multiplier circuit before the phase-locked loop transitions from power-saving mode to normal mode.

9 Claims, 8 Drawing Sheets

(51) Int. Cl.
*H03L 7/08* (2006.01)
*H04B 10/272* (2013.01)
*H04J 3/06* (2006.01)
*H04W 52/02* (2009.01)
*H04L 7/033* (2006.01)
*H04J 14/02* (2006.01)

(52) U.S. Cl.
CPC .......... *H04J 14/0267* (2013.01); *H04J 14/0282* (2013.01)

(56) References Cited

FOREIGN PATENT DOCUMENTS

| | | |
|---|---|---|
| JP | 2006-203908 A | 8/2006 |
| JP | 2008-153754 A | 7/2008 |
| JP | 2008-153754 A | 2/2011 |

\* cited by examiner

CLOCK AND DATA RECOVERY UNIT AND POWER CONTROL METHOD THEREFOR AND PON SYSTEM

TECHNICAL FIELD

The present invention mainly relates to a clock and data recovery unit on the optical network unit side and a power control method therefor in a PON (Passive Optical Network) system which is a P2MP (Point To Multipoint) communication system.

BACKGROUND ART

In a P2MP communication system, multiple optical network units are connected to a single optical line terminal through optical fibers. The optical network units are not always performing communication and have halt time. Hence, for the purpose of reducing the power consumption of an optical network unit, there is a suggestion that the optical network unit is placed in a halt state (see, for example, Patent Literature 1). In this case, for example, the optical network unit needs to wake up from the halt state after a certain period of time and perform normal operation. However, unless a source clock is stably generated before a clock and data recovery unit of the optical network unit returns to a normal operating state from a halt state, communication may fail. Hence, to prevent such events, those devices involved in phase-lock control for clock and data recovery are placed on standby in a normal operable state until a source clock is stably generated.

CITATION LIST

Patent Literature

Patent Literature 1: Japanese Unexamined Patent Publication No. 2008-153754

SUMMARY OF INVENTION

Technical Problem

However, in a conventional clock and data recovery unit such as that described above, power consumption during standby is a waste. In particular, in the case of application to a clock and data recovery unit in a 10 Gbps-class optical network unit, wasted power consumption is considered to be large.

In view of such a problem, an object of the present invention is to reduce wasted power consumption caused when a clock and data recovery unit is activated from a power-saving state, and to allow to perform rapid, secure communication.

Solution to Problem (1) The present invention is directed to a clock and data recovery unit used for optical communication using a burst signal, the clock and data recovery unit including: a reference clock multiplier circuit that multiplies a reference clock signal and outputs a multiplied reference clock signal; a phase-locked loop that can be set to power-saving mode in addition to normal mode and that includes a voltage-controlled oscillator, the phase-locked loop recovering a clock signal and a data signal from input signals; and a frequency training loop that includes the voltage-controlled oscillator and performs synchronous oscillation training by the voltage-controlled oscillator using the reference clock multiplier circuit before the phase-locked loop transitions from the power-saving mode to the normal mode.

In the clock and data recovery unit configured in the above-described manner, synchronous oscillation training by the voltage-controlled oscillator is performed using the reference clock multiplier circuit before the phase-locked loop set to the power-saving mode transitions to the normal mode. By this, the training is performed in a short period of time, enabling to rapidly establish synchronization and allow the phase-locked loop to transition to the normal mode.

(2) In addition, in the clock and data recovery unit of the above-described (1), power-saving can be achieved by stopping the phase-locked loop, based on an instruction from a communication counterpart.

In this case, by stopping (powering off) the phase-locked loop, power-saving can be achieved.

(3) In addition, in the clock and data recovery unit of the above-described (1), power-saving may be achieved by stopping at least one of the phase-locked loop and the frequency training loop, based on an instruction from a communication counterpart.

In this case, when communication is not performed, by stopping (powering off) the phase-locked loop and also stopping the frequency training loop, further power-saving can be achieved. In addition, in the normal mode in which an instruction on communication is provided from the communication counterpart, too, by stopping the frequency training loop which is not necessary, power-saving can be achieved while having the frequency training loop.

(4) In addition, in the clock and data recovery unit of the above-described (3), when a period during which power-saving is to be achieved is longer than a predetermined period, the reference clock multiplier circuit may be stopped.

In this case, for example, when a period during which power-saving is to be achieved continues for a longer period than a predetermined period because of not performing communication, by stopping (powering off) the reference clock multiplier circuit, too, further power-saving can be achieved.

(5) In addition, in any of the clock and data recovery units of the above-described (2) to (4), it is preferred that the frequency training loop start its operation at least an amount of time before end time of a period of time during which power-saving is to be achieved, the amount of time being required for the frequency training loop to complete its operation, and the period of time being instructed by the communication counterpart.

In this case, at the end time of a period of time during which power-saving is to be achieved, frequency training (synchronous oscillation) has been completed. Thus, at the end time, the phase-locked loop can securely recover a clock signal and a data signal.

(6) Meanwhile, the present invention is directed to a power control method for a clock and data recovery unit used for optical communication using a burst signal and including a reference clock multiplier circuit that multiplies a reference clock signal and outputs a multiplied reference clock signal; a phase-locked loop that includes a voltage-controlled oscillator and recovers a clock signal and a data signal from input signals; and a frequency training loop including the voltage-controlled oscillator, the method including: (i) going to standby with the reference clock signal multiplied and ready to be outputted and with both of the phase-locked loop and the frequency training loop set to power-saving mode; (ii) when the phase-locked loop transitions from the power-saving mode to the normal mode, before the transition, allowing the frequency training loop to operate using the reference clock multiplier circuit; and (iii) thereafter allowing the phase-locked loop to operate in the normal mode and stopping operation of at least one of the reference clock multiplier circuit and the frequency training loop.

According to a power control method such as that described above, synchronous oscillation training by the voltage-controlled oscillator is performed using the reference clock multiplier circuit before the phase-locked loop set to power-saving mode transitions to the normal mode. By this, the training is performed in a short period of time, enabling to rapidly establish synchronization and allow the phase-locked loop to transition to the normal mode.

(7) In addition, the present invention is directed to a PON system including a plurality of optical network units and a common optical line terminal which are connected to each other through optical fibers, each of the optical network units including a clock and data recovery unit used for optical communication using a burst signal, wherein the clock and data recovery unit includes: a reference clock multiplier circuit that multiplies a reference clock signal and outputs a multiplied reference clock signal; a phase-locked loop that includes a voltage-controlled oscillator and recovers a clock signal and a data signal from input signals; and a frequency training loop including the voltage-controlled oscillator, and the optical line terminal includes a managing unit that can individually set the phase-locked loop and the frequency training loop to the normal mode or power-saving mode and that allows, when the phase-locked loop transitions from the power-saving mode to the normal mode, the frequency training loop to operate using the reference clock multiplier circuit before the transition.

According to a PON system such as that described above, in an optical network unit, synchronous oscillation training by the voltage-controlled oscillator is performed using the reference clock multiplier circuit before the phase-locked loop set to the power-saving mode transitions to the normal mode. By this, the training is performed in a short period of time, enabling to rapidly establish synchronization and allow the phase-locked loop to transition to the normal mode.

Advantageous Effects of Invention

According to the clock and data recovery unit, power control method, and PON system of the present invention, wasted power consumption caused when the clock and data recovery unit is activated from a power-saving state is reduced and rapid, secure communication can be performed.

DESCRIPTION OF EMBODIMENTS

<Overall Configuration of a PON System>

Figure 1:
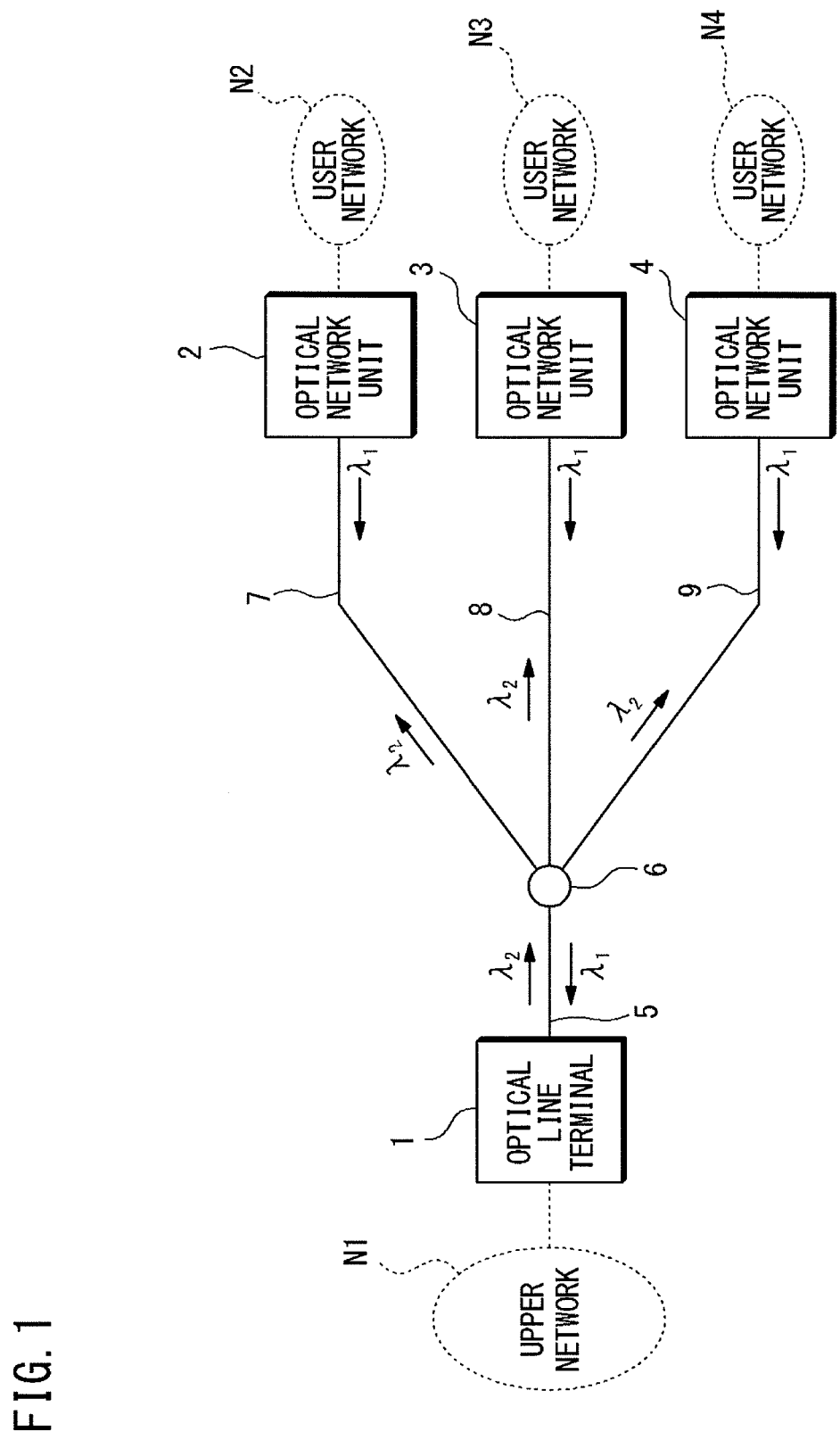
FIG. 1 is a connection diagram of a PON system according to one embodiment of the present invention.

FIG. 1 is a connection diagram of a PON system according to one embodiment of the present invention. In the drawing, an optical line terminal 1 is installed as a central station for a plurality of optical network units 2 to 4 connected thereto in a P2MP relationship. The optical network units 2 to 4 are installed in PON system subscribers' homes, respectively. In this system, there is formed an optical fiber network (5 to 9) where a single optical fiber 5 (main line) connected to the optical line terminal 1 is split into a plurality of optical fibers (branch lines) 7 to 9 through an optical coupler 6. The optical network units 2 to 4 are connected to the ends of the split optical fibers 7 to 9, respectively. Furthermore, the optical line terminal 1 is connected to an upper network N1, and the optical network units 2, 3, and 4 are connected to their respective user networks N2, N3, and N4.

Note that although FIG. 1 shows three optical network units 2 to 4, for example, 32 optical network units can be connected by splitting an optical fiber into 32 optical fibers through a single optical coupler 6. Note also that although in FIG. 1 only one optical coupler 6 is used, by providing a plurality of optical couplers longitudinally, more optical network units can be connected to the optical line terminal 1.

In FIG. 1, in the upstream direction from the optical network units 2 to 4 to the optical line terminal 1, data is transmitted at wavelength $\lambda_1$. On the other hand, in the downstream direction from the optical line terminal 1 to the optical network units 2 to 4, data is transmitted at wavelength $\lambda_2$. The wavelengths $\lambda_1$ and $\lambda_2$ can take any value in the following range, based on Clause 60 of IEEE Standard 802.3ah-2004:

1260 nm≤$\lambda_1$≤1360 nm 1480 nm≤$\lambda_2$≤1500 nm.

In addition, although the transmission rates of the optical network units 2, 3, and 4 for communication in the upstream direction may be different from one another, here, the transmission rates are the same (e.g., 10 Gbps). In addition, the transmission rate for downstream communication from the optical line terminal 1 to the optical network units 2 to 4 is of one type (e.g., 10 Gbps).

<Configuration of the Optical Line Terminal>

Figure 2:
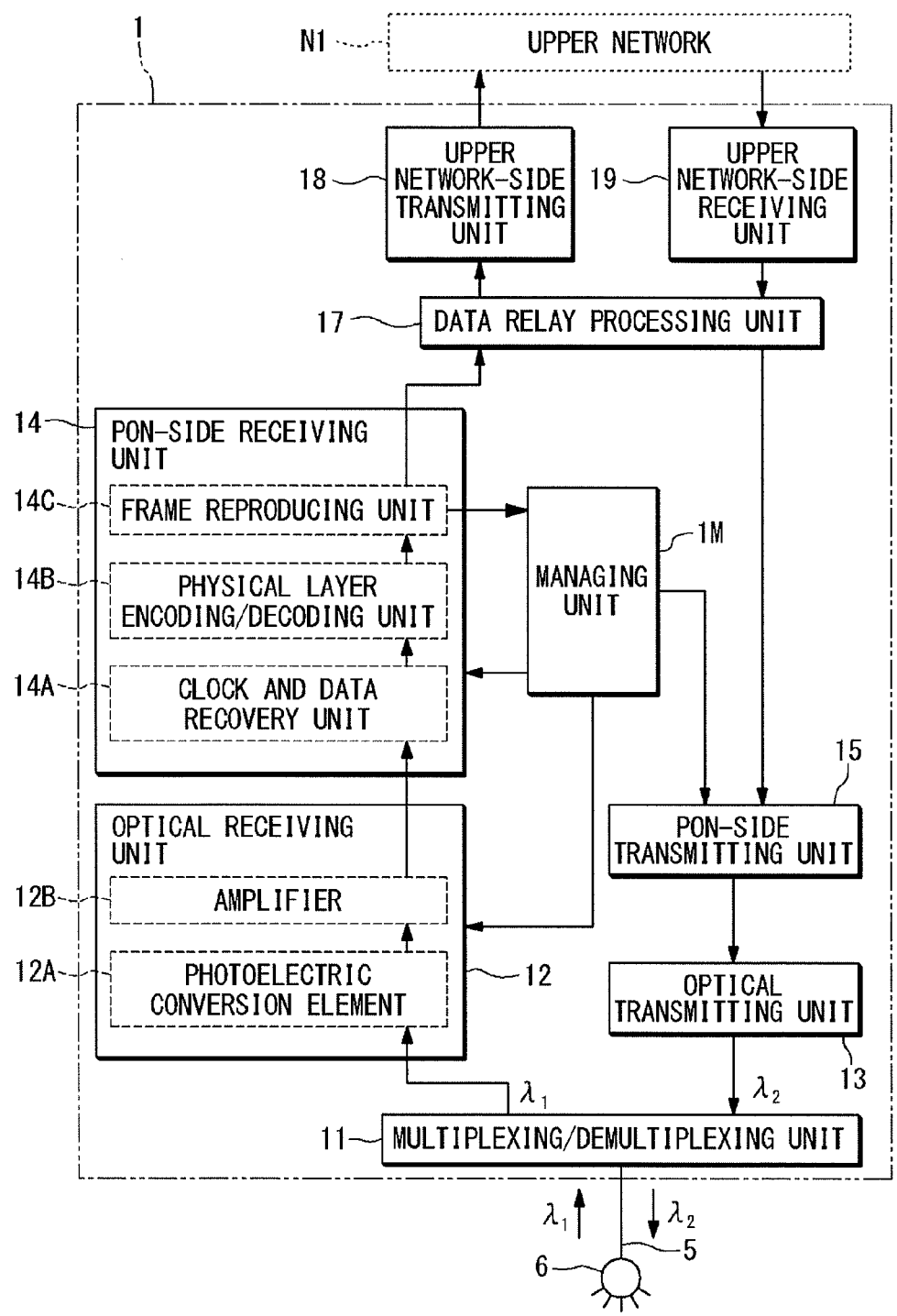
FIG. 2 is a block diagram showing an outline of the internal configuration of an optical line terminal.

FIG. 2 is a block diagram showing an outline of the internal configuration of the optical line terminal 1. The units (11 to 15, 17 to 19, and 1M) included in the optical line terminal 1 are connected to each other as shown in the drawing. In the drawing, a frame from the upper network N1 is received by an upper network-side receiving unit 19 and sent to a data relay processing unit 17. The data relay processing unit 17 passes the frame to a PON-side transmitting unit 15. The frame is converted by an optical transmitting unit 13 into an optical signal with wavelength $\lambda_2$ and a predetermined transmission rate. The optical signal is sent to the optical network units 2 to 4 (FIG. 1) through a multiplexing/demultiplexing unit 11.

On the other hand, optical signals (wavelength $\lambda_1$ and a predetermined transmission rate) transmitted in the upstream direction from the optical network units 2 to 4 (FIG. 1) pass through the multiplexing/demultiplexing unit 11 and are received by an optical receiving unit 12. The optical receiving unit 12 includes therein a photoelectric conversion element 12A and an amplifier 12B. The photoelectric conversion element 12A is a semiconductor light-receiving element such as a photodiode or an avalanche photodiode, and outputs an electrical signal according to the amount of light received. The amplifier 12B amplifies and outputs the electrical signal. The output signal from the amplifier 12B is inputted to a PON-side receiving unit 14.

The PON-side receiving unit 14 includes therein a clock and data recovery unit 14A, a physical layer encoding/decoding unit 14B, and a frame reproducing unit 14C. The clock and data recovery unit 14A recovers a timing component (clock signal) and a data signal in synchronization with the electrical signal received from the amplifier 12B. The physical layer encoding/decoding unit 14B decodes code provided to the recovered data. The frame reproducing unit 14C detects frame boundaries from the decoded data to reconstruct, for example, Ethernet (registered trademark) frames. In addition, the frame reproducing unit 14C reads a header portion of a frame and thereby determines whether the received frame is a data frame or a frame for control information for media access control such as a report frame.

Note that an example of the control information includes an MPCP (Multi-Point Control Protocol) PDU (Protocol Data Unit) described in Clause 64 of IEEE Standard 802.3ah-2004. A grant which is control information used by the optical line terminal 1 for instructing the optical network units 2 to 4 on the sending start time of data in the upstream direction and the allowed sending amount of data in the upstream direction, and a report which is control information used by the optical network units 2 to 4 to notify the optical line terminal 1 of a value regarding the amount of accumulated data in the upstream direction are types of the MPCP PDU.

If, as a result of the above-described determination, the frame is a data frame, then the frame reproducing unit 14C sends the data frame to the data relay processing unit 17. The data relay processing unit 17 performs predetermined relay processes such as changing the header information of the data frame and performing transmission control on an upper network-side transmitting unit 18. The processed frame is sent out to the upper network N1 from the upper network-side transmitting unit 18. If, as a result of the above-described determination, the frame is a report frame, then the frame reproducing unit 14C sends the report frame to a managing unit (which is composed of, for example, a MAC-IC) 1M. The managing unit 1M generates, based on the report, a grant frame serving as control information. The grant frame is transmitted from the PON-side transmitting unit 15 and the optical transmitting unit 13 through the multiplexing/demultiplexing unit 11.

The managing unit 1M stores transmission rates used by the optical network units 2 to 4 and identifies, based on a grant, timing at which a burst signal is received next and the transmission rate of the burst signal. Namely, the managing unit 1M manages a schedule for signal reception. Then, the identified transmission rate is notified to the optical receiving unit 12 and the PON-side receiving unit 14. The optical receiving unit 12 and the PON-side receiving unit 14 can allow their reception functions to support the identified transmission rate in accordance with that timing.

In addition, when there is no schedule for communication with the optical network units 2 to 4, the managing unit 1M can stop any of the functions of the optical network units 2 to 4 for a predetermined period of time to place the optical network units 2 to 4 in a power-saving state (details will be described later).

<Configuration of the Optical Network Units>

Figure 3:
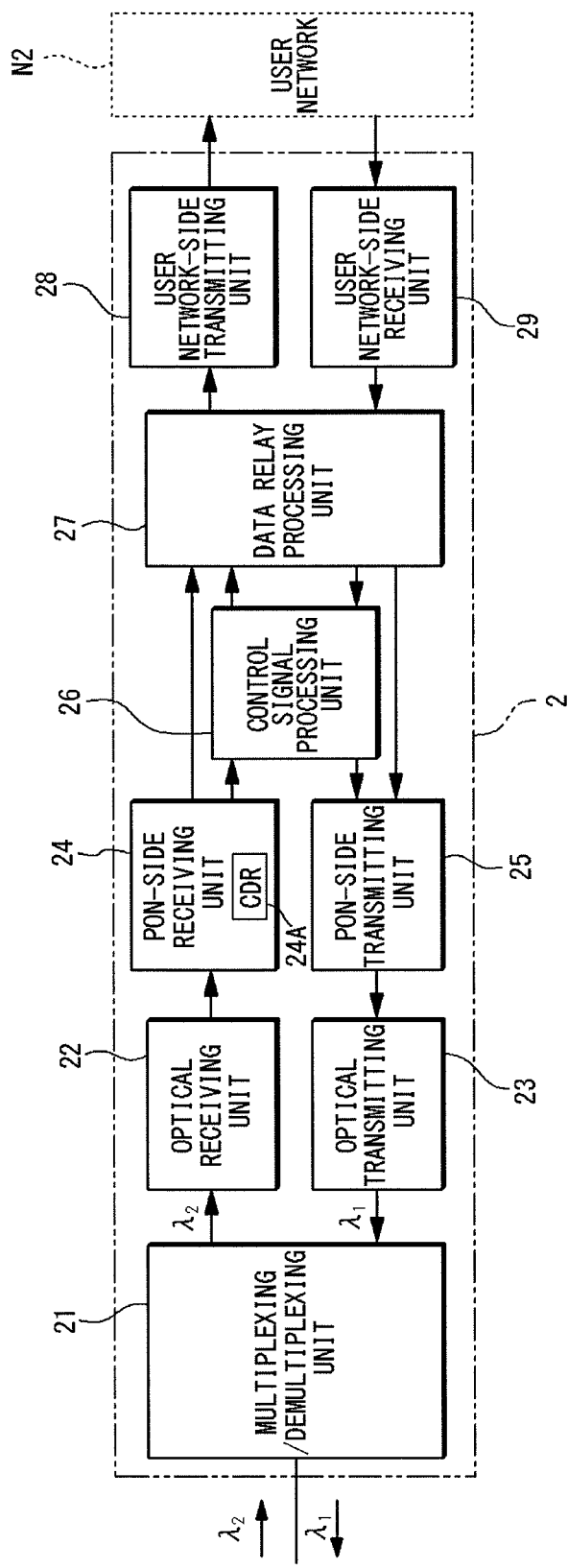
FIG. 3 is a block diagram showing an outline of the internal configuration of an optical network unit.

FIG. 3 is a block diagram showing an outline of the internal configuration of the optical network unit 2. Note that since the configuration is also the same for the optical network units 3 and 4, the optical network unit 2 will be described as a representative. The units (21 to 29) included in the optical network unit 2 are connected to each other as shown in the drawing. In FIG. 3, an optical signal transmitted in the downstream direction from the optical line terminal 1 (FIG. 1) passes through a multiplexing/demultiplexing unit 21 and is converted by an optical receiving unit 22 into an electrical signal. Furthermore, the electrical signal is received by a PON-side receiving unit 24. As with the optical line terminal 1, the PON-side receiving unit 24 includes a clock and data recovery unit 24A (details will be described later).

The PON-side receiving unit 24 reads a header portion (including a preamble portion) of a received frame and thereby determines whether the frame is destined for the optical network unit 2 (here, it indicates that the frame is destined for the optical network unit 2 or an optical network unit in the user network N2 under the control of the optical network unit 2). If, as a result of the determination, the frame is destined for the optical network unit 2, then the frame is captured. Otherwise, the frame is discarded. For example, an example of the header information for performing the above-described destination determination includes a Logical Link IDentifier (LLID) described in IEEE Standard 802.3ah-2004.

Furthermore, the PON-side receiving unit 24 reads the header portion of the frame and thereby determines whether the received frame is a data frame or a grant frame. If, as a result of the determination, the frame is a data frame, then the PON-side receiving unit 24 sends the data frame to a data relay processing unit 27. The data relay processing unit 27 performs predetermined relay processes such as performing transmission control on a user network-side transmitting unit 28. The processed frame is sent out to the user network N2 from the user network-side transmitting unit 28.

If, as a result of the above-described determination, the frame is a grant frame, then the PON-side receiving unit 24 transfers the grant frame to a control signal processing unit 26. The control signal processing unit 26 instructs, based on the grant frame, the data relay processing unit 27 to perform sending in the upstream direction.

On the other hand, a frame from the user network N2 is received by a user network-side receiving unit 29 and is transferred to the data relay processing unit 27. The transferred frame is temporarily accumulated in a buffer memory in the data relay processing unit 27, and the amount of data in the frame is notified to the control signal processing unit 26. The control signal processing unit 26 performs transmission control on a PON-side transmitting unit 25. Specifically, the control signal processing unit 26 allows the PON-side transmitting unit 25 to output the frame accumulated in the buffer memory at predetermined timing, and generates a report frame based on the notified amount of data accumulated in the buffer memory and allows the PON-side transmitting unit 25 to output the report frame. The output from the PON-side transmitting unit 25 is converted by an optical transmitting unit 23 into an optical signal. The optical signal is transmitted in the upstream direction through the multiplexing/demultiplexing unit 21, as a signal with wavelength $\lambda_1$ and a predetermined transmission rate.

<Basic Operation Sequence of the PON System>

Next, the operation procedure of the PON system configured in the above-described manner will be described with reference to a sequence diagram of FIG. 4. Note that although the sequence diagram shows operation performed between the optical line terminal 1 and the optical network unit 2, the same operation is also performed for other optical network units 3 and 4.

Figure 4:
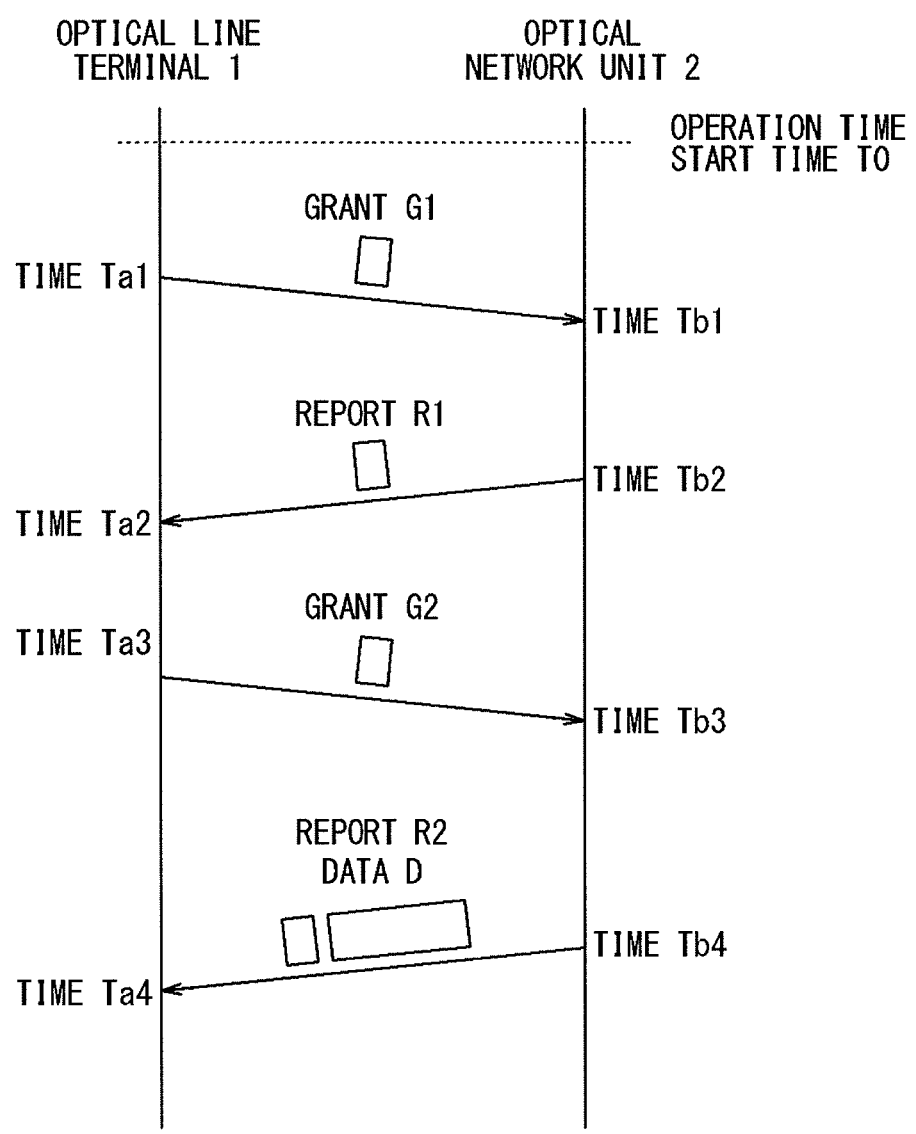
FIG. 4 is a basic operation sequence diagram of the PON system.

In FIG. 4, the optical line terminal 1 has already computed RTT (Round Trip Time) for the optical network unit 2 at the time of operation time start time T0. At time Ta1, the optical line terminal 1 transmits a grant (grant frame) G1 including report sending start time Tb2, to the optical network unit 2 to allow the optical network unit 2 to notify of a required sending amount. The report sending start time Tb2 is calculated such that a report does not collide with reports transmitted from other optical network units 3 and 4.

When the optical network unit 2 receives the grant G1 intended therefor, the optical network unit 2 calculates a required sending amount by referring to the amount of data accumulated in the buffer memory in the data relay processing unit 27, and sends out a report (report frame) R1 including the required sending amount to the optical line terminal 1 at report sending start time Tb2 included in the grant G1.

When the optical line terminal 1 receives the report R1, the optical line terminal 1 computes a value that is less than or equal to a fixed or variable maximum allowed sending amount and that allows as much data as possible to be sent among the amount of data in the buffer memory included in the report R1. Then, the optical line terminal 1 inserts the computation result in a grant G2, as an allowed sending amount. When the required sending amount included in the report R1 is zero, a computation result obtained by the optical line terminal 1 is zero and thus a frequency band is not allocated. However, since there is a need to allow the optical network unit 2 to send out a report R2, the optical line terminal 1 always sends out a grant G2 to the optical network unit 2.

Sending start time Tb4 included in the grant G2 is calculated such that data and a report do not collide with data or reports from other optical network units 3 and 4. To do so, the last schedule time to receive optical network unit data, the last allowed sending amount for the optical network unit 2, and the current RTT for the optical network unit 2 which are already computed and a guard time which is fixed time are used. Note that the optical line terminal 1 calculates time Ta3 at which the grant G2 including the allowed sending amount and sending start time Tb4 is sent out, such that the grant G2 arrives at the optical network unit 2 before sending start time Tb4.

When the optical network unit 2 receives the grant G2 intended therefor, the optical network unit 2 sends out data D, the amount of which corresponds to the allowed sending amount, together with a report R2 including the next required sending amount, to the optical line terminal 1 at sending start time Tb4 included in the grant G2. The report R2 is sent out immediately before or immediately after the data D. When the report R2 is sent out immediately before the data D, a value reported to the optical line terminal 1 as the required sending amount is the difference between the amount of data accumulated in the buffer memory and the amount of the data D.

When the optical line terminal 1 receives the data D and the report R2, the optical line terminal 1 sends out the data D to the upper network N1 and performs, for the report R2, the same process as that performed on the report R1. The above-described sequence processes are independently performed on all of the optical network units 2 to 4. The processes performed at time Ta3 to Ta4 are repeated until the operation time ends.

Meanwhile, aside from a sequence such as that described above, when there is no data scheduled to be transmitted from the optical network unit 2, an instruction to transition from normal mode to power-saving mode can be provided from the optical line terminal 1 to the optical network unit 2. Power-saving is achieved by, for example, turning off the power to each unit in the optical network unit 2. In addition, when a predetermined period of time has elapsed from a state in which the functions are halted in power-saving mode, the optical network unit 2 returns by itself to normal mode from power-saving mode. A problem arising here is the above-described clock and data recovery unit in the optical network unit 2. The clock and data recovery unit needs to be synchronized with a signal transmitted from the optical line terminal 1, and thus, needs to complete recovery of a clock from a received signal during the transition from power-saving mode to normal mode. In addition, at this time, it is desirable to suppress as much wasted power consumption as possible.

<Configuration of the Clock and Data Recovery Unit in the Optical Network Unit>

Hence, next, the configuration and function of the clock and data recovery unit in the optical network unit 2 (the same for 3 and 4) will be described in detail.

Figure 5:
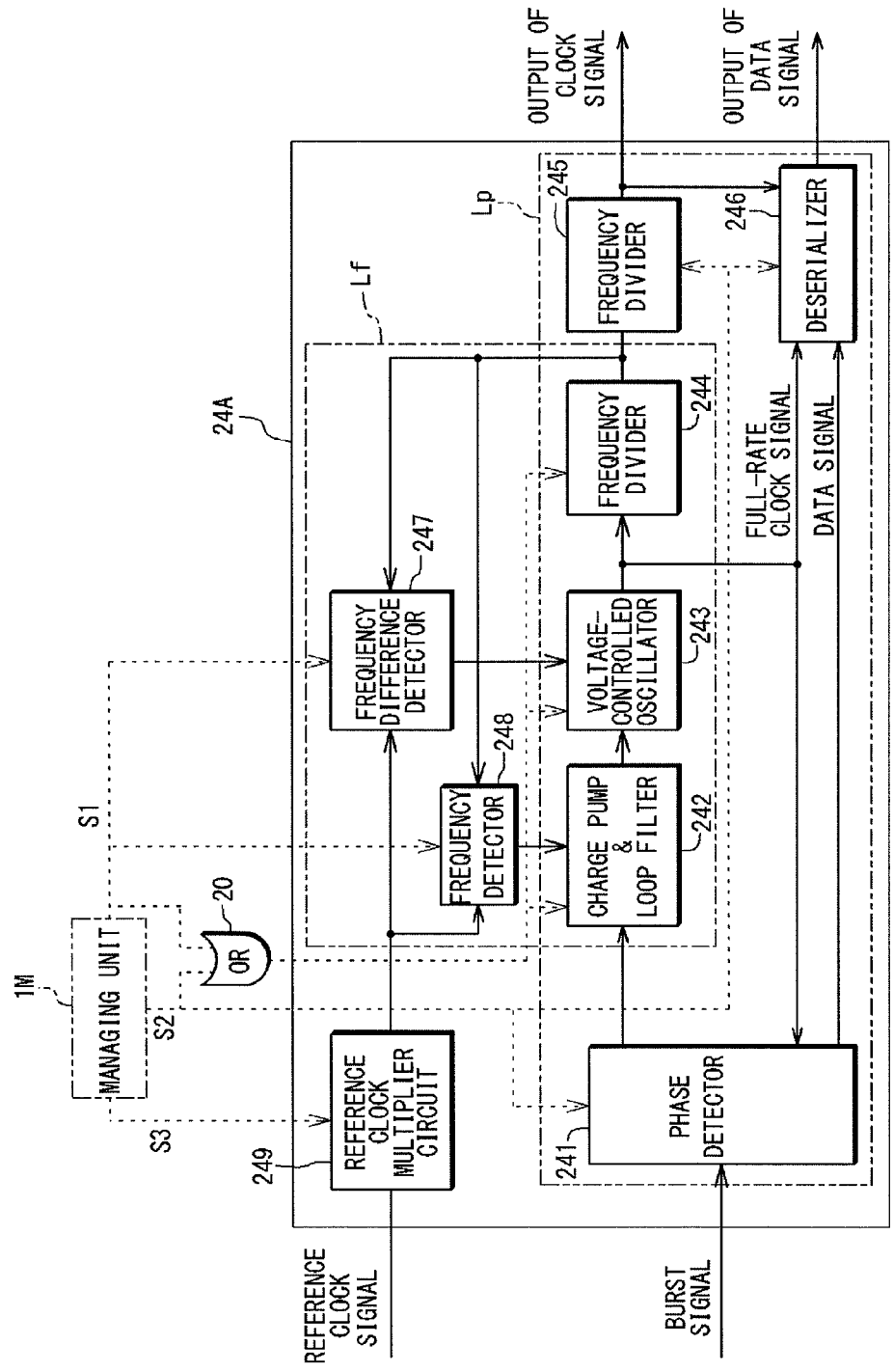
FIG. 5 is a block diagram showing an example of the circuit configuration of a clock and data recovery unit in the optical network unit.

FIG. 5 is a block diagram showing an example of the circuit configuration of the clock and data recovery unit 24A in the optical network unit 2. In the drawing, to the clock and data recovery unit 24A are inputted a reference clock signal from a clock (not shown) included in the optical network unit 2 and an optical signal which is a burst signal from the optical receiving unit 22 (FIG. 3). The optical signal includes information on a power-saving mode/normal mode selection instruction which is sent from the managing unit 1M in the optical line terminal 1. The content of the selection instruction has, for example, three types, signals S1, S2, and S3. In addition, an OR circuit 20 for receiving the signals S1 and S2 as OR is provided.

The clock and data recovery unit 24A recovers and outputs a clock signal and a data signal by a phase-lock scheme and includes, as function units forming a phase-locked loop Lp in normal mode, a phase detector 241, a charge pump and a loop filter (hereinafter, simply referred to as a loop filter) 242, a voltage-controlled oscillator (VCO or VCXO) 243, frequency dividers 244 and 245, and a deserializer 246, which are connected to each other as shown in the drawing.

Note that the deserializer 246 converts a recovered data signal into a parallel signal and outputs the parallel signal. To the deserializer 246 are inputted a data signal (serial) outputted from the phase detector 241, a full-rate clock signal outputted from the voltage-controlled oscillator 243, and a frequency-divided clock signal obtained by frequency-dividing the clock signal by the frequency dividers 244 and 245. Note that the deserializer is a known circuit and thus a detailed description thereof is omitted here.

Meanwhile, as another loop that shares a part of the phase-locked loop, a frequency training loop Lf is provided. Function units forming the frequency training loop Lf include a frequency difference detector 247 and a frequency detector 248 in addition to the loop filter 242, the voltage-controlled oscillator 243, and the frequency divider 244, which are connected to each other as shown in the drawing. The loop filter 242 and the voltage-controlled oscillator 243 are controlled by outputs from the frequency detector 248 and the frequency difference detector 247, respectively, in a direction in which frequencies coincide with each other. In addition, a reference clock multiplier circuit 249 multiplies the reference clock signal (e.g., by 16 times) and outputs the multiplied reference clock signal.

The higher the transmission rate of the burst signal, the higher the ratio with respect to the frequency of a reference clock provided by a normal quartz oscillator, etc. Thus, the time to train the voltage-controlled oscillator 243 to synchronously oscillate at a frequency conforming to a standard (frequency training time) gets longer. For example, in the case of 10 Gbps and a reference clock being on the order of 156 MHz, about several hundred nanoseconds is required. By increasing the multiplication ratio, the time can be reduced. Note, however, that the higher the ratio the higher the power consumption of the reference clock multiplier circuit 249.

<Operating Modes of the Clock and Data Recovery Unit>

[Power-Saving Mode]

Figure 6:
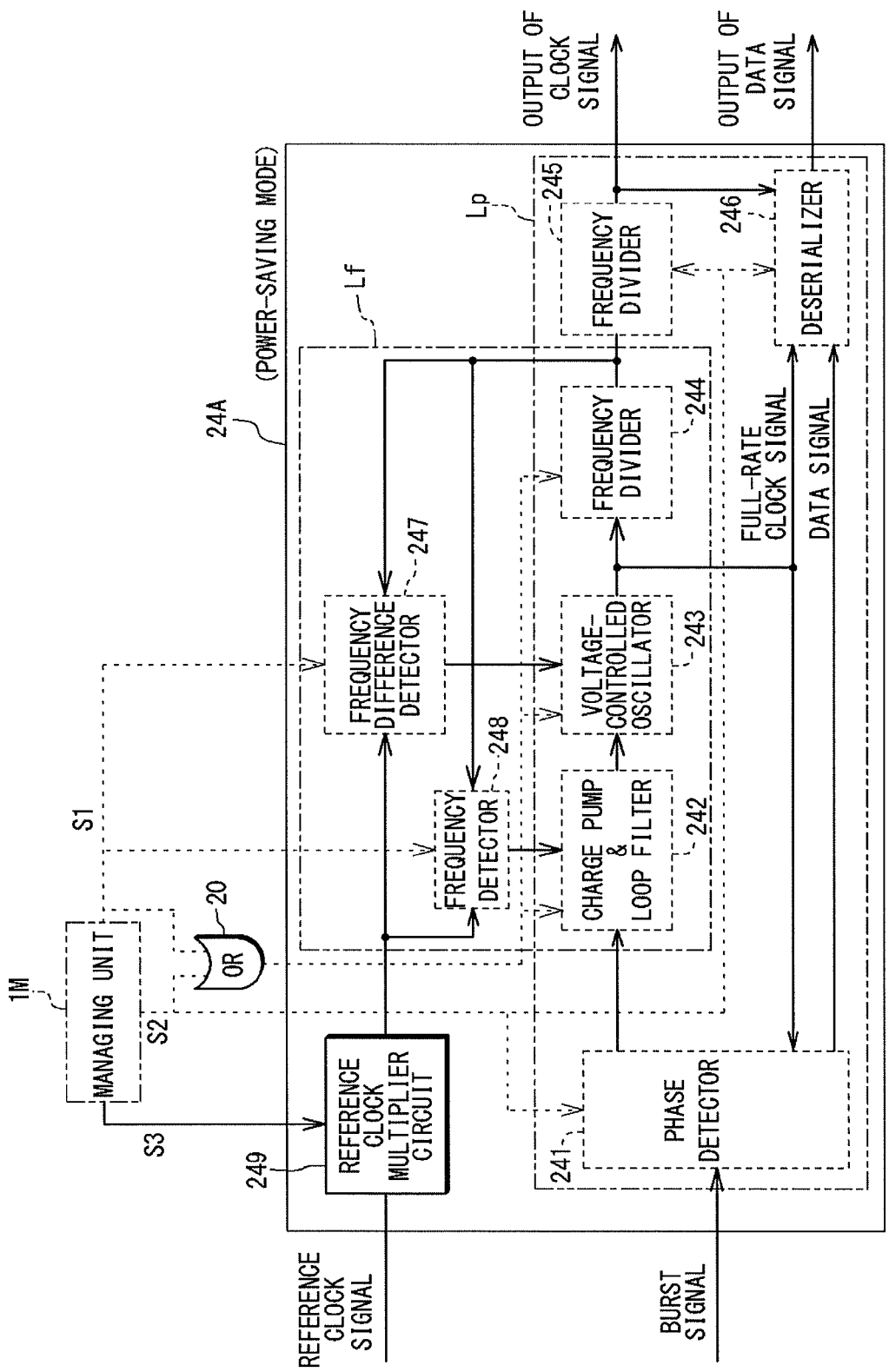
FIG. 6 is a block diagram conceptually showing the state of the clock and data recovery unit in power-saving mode, and a block shown by a solid line in the clock and data recovery unit indicates power-on, and a block shown by a dashed line indicates power-off.

FIG. 6 is a block diagram conceptually showing the state of the clock and data recovery unit 24A in power-saving mode. A block shown by a solid line in the clock and data recovery unit 24A indicates power-on, and a block shown by a dashed line indicates power-off (power saving). Specifically, in the drawing, a signal S3 from the managing unit 1M is at H level and thus the reference clock multiplier circuit 249 is in a power-on state (not power saving). On the other hand, a signal S1 from the managing unit 1M is at L level. The frequency difference detector 247 and the frequency detector 248 which are powered on by an H-level signal S1 are in a power-off state. A signal S2 from the managing unit 1M is at L level. The phase detector 241, the frequency divider 245, and the deserializer 246 which are powered on by an H-level signal S2 are in a power-off state. In addition, the OR of the signals S1 and S2 is at L level. The loop filter 242, the voltage-controlled oscillator 243, and the frequency divider 244 which are powered on by the OR being at H level are in a power-off state.

Namely, in this state, the reference clock multiplier circuit 249 is the only unit whose power is on in the clock and data recovery unit 24A. Since the reference clock multiplier circuit 249 is required for activation of frequency training mode which will be described later and has some startup convergence time upon power-on, it is preferred that the reference clock multiplier circuit 249 be thus left power on even when other portions are powered off. Note, however, that when the duration of power-saving mode is long, the power may be turned off until the above-described convergence time before frequency training starts. In this case, all of the main function units in the clock and data recovery unit 24A are powered off, enabling to reduce power consumption to a minimum.

[Frequency Training Mode]

Figure 7:
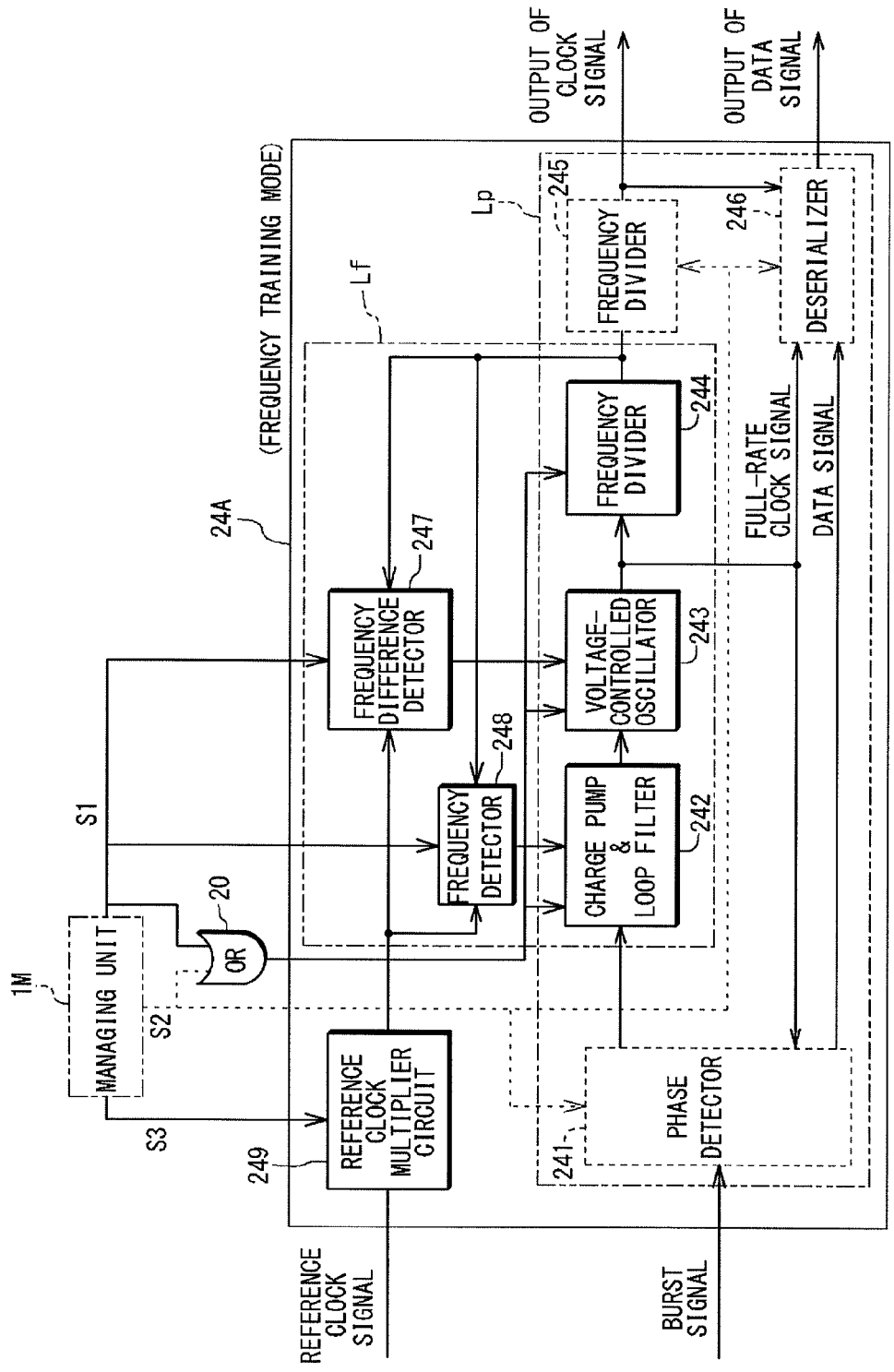
FIG. 7 is a block diagram conceptually showing the state of the clock and data recovery unit in frequency training mode, and a block shown by a solid line in the clock and data recovery unit indicates power-on, and a block shown by a dashed line indicates power-off.

FIG. 7 is a block diagram conceptually showing the state of the clock and data recovery unit 24A in frequency training mode. A block shown by a solid line in the clock and data recovery unit 24A indicates power-on, and a block shown by a dashed line indicates power-off (power saving). Specifically, in the drawing, a signal S3 from the managing unit 1M is at H level and thus the reference clock multiplier circuit 249 is in a power-on state. In addition, a signal S1 from the managing unit 1M is also at H level and thus the frequency difference detector 247 and the frequency detector 248 are in a power-on state. In addition, the OR of the signals S1 and S2 is at H level and thus the loop filter 242, the voltage-controlled oscillator 243, and the frequency divider 244 are in a power-on state. On the other hand, a signal S2 from the managing unit 1M is at L level and thus the phase detector 241, the frequency divider 245, and the deserializer 246 are in a power-off state.

This state is, so to speak, a transient transition mode from power-saving mode to normal mode. Specifically, synchronous oscillation frequency training by the voltage-controlled oscillator 243 is performed. By this, operation is performed such that a frequency obtained by dividing the oscillation frequency of the voltage-controlled oscillator 243 by the frequency divider 244 coincides with a frequency outputted from the reference clock multiplier circuit 249. By the coincidence, the mode ends.

[Normal Mode]

Figure 8:
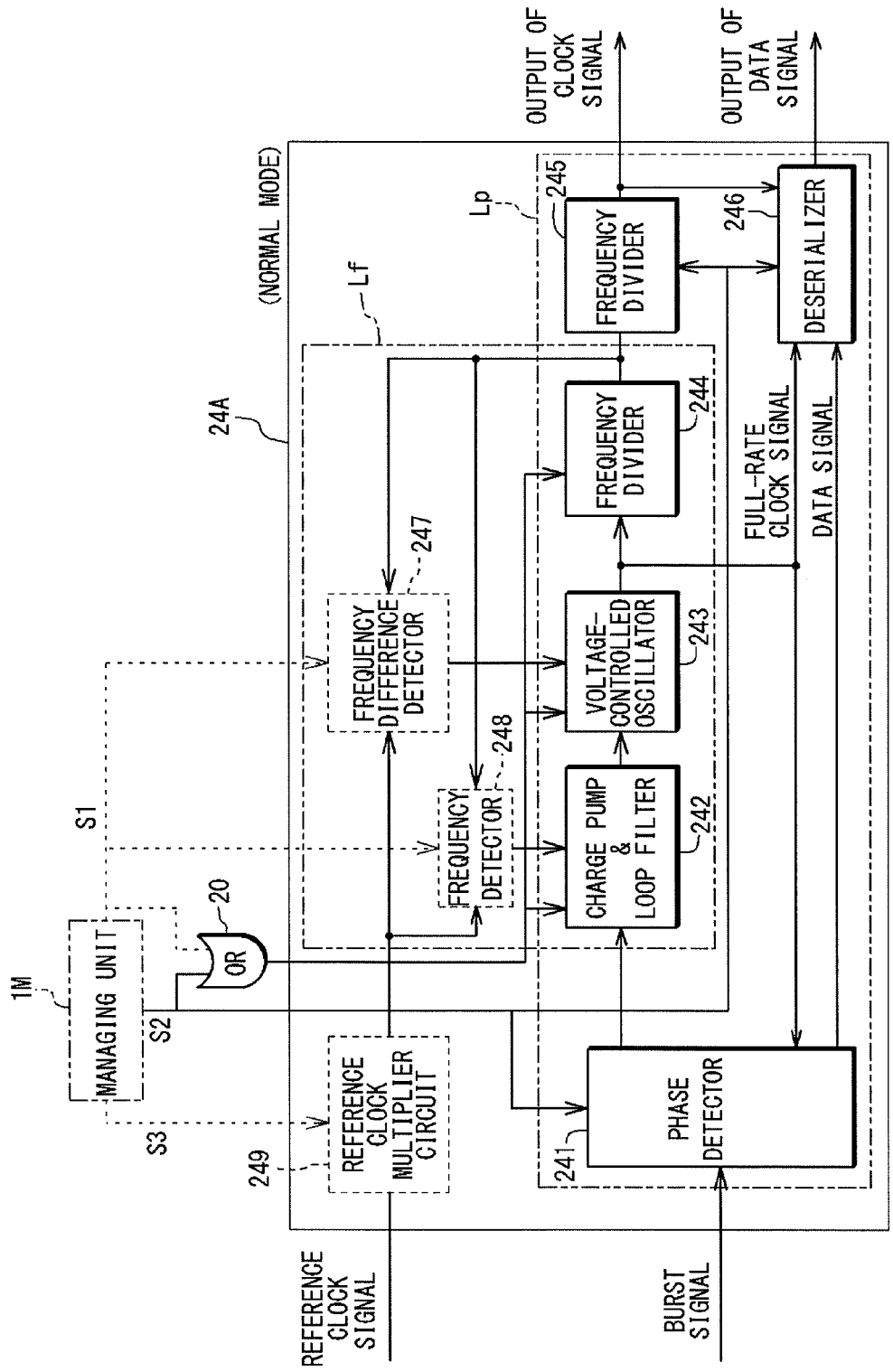
FIG. 8 is a block diagram conceptually showing the state of the clock and data recovery unit in normal mode, and a block shown by a solid line in the clock and data recovery unit indicates power-on, and a block shown by a dashed line indicates power-off.

Concurrently with the end of frequency training mode, a transition to normal mode is performed. FIG. 8 is a block diagram conceptually showing the state of the clock and data recovery unit 24A in normal mode. A block shown by a solid line in the clock and data recovery unit 24A indicates power-on, and a block shown by a dashed line indicates power-off. Specifically, in the drawing, a signal S3 from the managing unit 1M is at L level and thus the reference clock multiplier circuit 249 is in a power-off state. In addition, a signal S1 from the managing unit 1M is at L level and thus the frequency difference detector 247 and the frequency detector 248 are in a power-off state. On the other hand, a signal S2 from the managing unit 1M is at H level and thus the phase detector 241, the frequency divider 245, and the deserializer 246 are in a power-on state. Furthermore, the OR of the signals S1 and S2 is at H level and thus the loop filter 242, the voltage-controlled oscillator 243, and the frequency divider 244 are in a power-on state.

Namely, this state is a state in which a normal phase-locked loop is formed and the clock and data recovery unit 24A recovers and outputs a clock signal and a data signal in synchronization with a burst signal inputted thereto. The frequency difference detector 247, the frequency detector 248, and the reference clock multiplier circuit 249 are not necessary at this time point and thus are powered off. Namely, the frequency training loop Lf and the reference clock multiplier circuit 249 are both in a state in which their operation is stopped. Note, however, that both of them do not necessarily need to be stopped and either one may be stopped.

SUMMARY

As described above, in the clock and data recovery unit 24A according to the embodiment, before the phase-locked loop Lp set to power-saving mode transitions to normal mode, synchronous oscillation training by the voltage-controlled oscillator 243 is performed using the reference clock multiplier circuit 249. By this, the training is performed in a short period of time, enabling to rapidly establish synchronization and allow the phase-locked loop Lp to transition to normal mode. Accordingly, wasted power consumption caused when the clock and data recovery unit 24A is activated from a power-saving state is reduced, and rapidly, secure communication can be performed.

In addition, in power-saving mode, power-saving can be achieved by stopping (powering off) the phase-locked loop Lp, based on an instruction from the optical line terminal 1 which is a communication counterpart.

In addition, by further stopping the frequency training loop Lf, power-saving can be achieved.

Note that in normal mode in which an instruction on communication is provided from the optical line terminal 1, too, by stopping the frequency training loop which is not necessary, power-saving can be achieved while having the frequency training loop.

In addition, when a period during which power-saving is to be achieved is longer than a predetermined period, the reference clock multiplier circuit 249 may be stopped. Namely, in this case, for example, when a period during which power-saving is to be achieved continues for a longer period than a predetermined period because of not performing communication, by stopping (powering off) the reference clock multiplier circuit 249, too, further power-saving can be achieved.

Note that in the clock and data recovery unit 24A it is preferred that the frequency training loop Lf start its operation at least the amount of time required for the frequency training loop Lf to complete its operation, before the end time of a period of time during which power-saving is to be achieved, the period of time being instructed by the optical line terminal 1.

In this case, at the end time of a period of time during which power-saving is to be achieved, frequency training has been completed. Thus, at the end time, the phase-locked loop Lp can securely recover a clock signal and a data signal.

Note that the embodiment disclosed herein is to be considered in all respects as illustrative and not restrictive. The scope of the present invention is indicated by the appended claims, and all changes which come within the meaning and range of equivalency of the claims are therefore intended to be embraced therein.

REFERENCE SIGNS LIST

1: OPTICAL LINE TERMINAL
1M: MANAGING UNIT
2 to 4: OPTICAL NETWORK UNIT
5 and 7 to 9: OPTICAL FIBER
24A: CLOCK AND DATA RECOVERY UNIT
243: VOLTAGE-CONTROLLED OSCILLATOR
249: REFERENCE CLOCK MULTIPLIER CIRCUIT
Lf: FREQUENCY TRAINING LOOP
Lp: PHASE-LOCKED LOOP

The invention claimed is:

1. A clock and data recovery unit used for optical communication using a burst signal, the clock and data recovery unit comprising:
a reference clock multiplier circuit that multiplies a reference clock signal and outputs a multiplied reference clock signal;
a phase-locked loop that can be set to power-saving mode in addition to normal mode and that includes a voltage-controlled oscillator, the phase-locked loop recovering a clock signal and a data signal from input signals; and
a frequency training loop that includes the voltage-controlled oscillator and performs synchronous oscillation training by the voltage-controlled oscillator using the reference clock multiplier circuit before the phase-locked loop transitions from the power-saving mode to the normal mode.

2. The clock and data recovery unit according to claim 1, wherein power-saving is achieved by stopping the phase-locked loop, based on an instruction from a communication counterpart.

3. The clock and data recovery unit according to claim 2, wherein the frequency training loop starts its operation at least an amount of time before end time of a period of time during which the power-saving is to be achieved, the amount of time being required for the frequency training loop to complete its operation, and the period of time being instructed by the communication counterpart.

4. The clock and data recovery unit according to claim 1, wherein power-saving is achieved by stopping at least one of the phase-locked loop and the frequency training loop, based on an instruction from a communication counterpart.

5. The clock and data recovery unit according to claim 4, wherein when a period during which the power-saving is to be achieved is longer than a predetermined period, the reference clock multiplier circuit is stopped.

6. The clock and data recovery unit according to claim 5, wherein the frequency training loop starts its operation at least an amount of time before end time of a period of time during which the power-saving is to be achieved, the amount of time being required for the frequency training loop to complete its operation, and the period of time being instructed by the communication counterpart.

7. The clock and data recovery unit according to claim 4, wherein the frequency training loop starts its operation at least an amount of time before end time of a period of time during which the power-saving is to be achieved, the amount of time being required for the frequency training loop to complete its operation, and the period of time being instructed by the communication counterpart.

8. A power control method for a clock and data recovery unit used for optical communication using a burst signal and including a reference clock multiplier circuit that multiplies a reference clock signal and outputs a multiplied reference clock signal; a phase-locked loop that includes a voltage-controlled oscillator and recovers a clock signal and a data signal from input signals; and a frequency training loop for synchronous oscillation by the voltage-controlled oscillator, the method comprising:
going to standby with the reference clock signal multiplied and ready to be outputted and with both of the phase-locked loop and the frequency training loop set to power-saving mode;
when the phase-locked loop transitions from the power-saving mode to normal mode, before the transition, allowing the frequency training loop to operate using the reference clock multiplier circuit; and
thereafter allowing the phase-locked loop to operate in the normal mode and stopping operation of at least one of the reference clock multiplier circuit and the frequency training loop.

9. A PON system including a plurality of optical network units and a common optical line terminal which are connected to each other through optical fibers, each of the optical network units including a clock and data recovery unit used for optical communication using a burst signal, wherein
the clock and data recovery unit includes:
a reference clock multiplier circuit that multiplies a reference clock signal and outputs a multiplied reference clock signal;
a phase-locked loop that includes a voltage-controlled oscillator and recovers a clock signal and a data signal from input signals; and
a frequency training loop for synchronous oscillation by the voltage-controlled oscillator, and
the optical line terminal includes a managing unit that can individually set the phase-locked loop and the frequency training loop to normal mode or power-saving mode and that allows, when the phase-locked loop transitions from the power-saving mode to the normal mode, the frequency training loop to operate using the reference clock multiplier circuit before the transition.

* * * * *